United States Patent [19]

Gaudin et al.

[11] Patent Number: 4,476,578

[45] Date of Patent: Oct. 9, 1984

[54] DEVICE FOR DETECTING THE OPTIMUM ANODE LOAD IMPEDANCE OF A TUBE TRANSMITTER IN A HIGH FREQUENCY TRANSMISSION CHAIN

[75] Inventors: Daniel Gaudin; Philippe Le Gars, both of Paris, France

[73] Assignee: Thomson-CSF, Paris, France

[21] Appl. No.: 443,635

[22] Filed: Nov. 22, 1982

[30] Foreign Application Priority Data

Nov. 27, 1981 [FR] France ................. 81 22274

[51] Int. Cl.³ .................. H04B 17/00; H04B 1/04; H03H 7/38
[52] U.S. Cl. .................. 455/115; 455/129; 333/17 M; 343/860
[58] Field of Search .......... 455/91, 107, 115, 121, 455/123, 129; 343/703, 850, 852, 860, 861; 333/17 M, 32

[56] References Cited

U.S. PATENT DOCUMENTS 3,271,684  9/1966  Simon .
3,355,667 11/1967  Bruene .
3,786,355  1/1974  Midkiff ................. 455/115
3,919,643 11/1975  Templin ................ 455/123
4,209,758  6/1980  Skedkerud et al. ....... 455/129

FOREIGN PATENT DOCUMENTS 2923277 11/1980 Fed. Rep. of Germany .

Primary Examiner—Jin F. Ng
Attorney, Agent, or Firm—Roland Plottel

[57] ABSTRACT

A device for detecting the optimum anode load impedence of a transmitter tube in a high frequency transmission chain. A phase shift circuit phase shifts by $k\pi/2$ (with k being a positive or negative uneven integer) the phase difference between the input and output voltages of the tube. The phase shifted voltages are multiplying together in a circuit, and the mean value of the product is then calculated. Cancellation of this mean value corresponds to the anode load impedance passing through a purely resistive value. Thus, the circuit allows the phase matching detection to be made, which is independent of any modulus matching detection.

4 Claims, 2 Drawing Figures

DEVICE FOR DETECTING THE OPTIMUM ANODE LOAD IMPEDANCE OF A TUBE TRANSMITTER IN A HIGH FREQUENCY TRANSMISSION CHAIN

BACKGROUND OF THE INVENTION

1. Field of the Invention

The present invention relates to a device for detecting the optimum anode load impedance of a tube transmitter in a high frequency transmission chain.

2. Description of the Prior Art

A tube transmitter cannot be directly loaded by a transmission antenna whose impedance is much too low; there is generally used between the anode and the antenna a matching cell using variable inductances and capacities which must be tuned in accordance with the working frequency and the impedance of the antenna.

This adjustment may be controlled in numerous ways which all boil down to ensuring that the load impedance of the tube is optimum, which corresponds to a maximum efficiency of the tube and maximum power radiated by the antenna. They are based on different principles also involving different technologies.

A first method consists in measuring the HF current (I) and the HF voltage (V) at the output of the tube. The ratio of these two measurements gives directly the desired parameter Za but as soon as the power becomes high it is difficult to obtain the current information by toric coupling.

A second method consists in measuring the mean current consumed and in effecting a comparison with the HF power transmitted by the transmitter. The technology is simple but the accuracy is poor and the adjusting algorithm is complex.

A third method consists in substituting for the measurement of the V/I ratio, measurements (easier to make) of the HF voltaes existing respectively at the input electrode of the tube ($V_E$) and at the output electrode ($V_S$). These two elements are connected by the relationship:

$$V_S = S\, Z_a\, V_E$$

where Za is the desired anode load impedance and S a constant characteristic of the tube, called slope. Matching consists then in detecting, during adjustment of the anode load impedance, the precise moment when the phase of the $V_S/V_E$ ratio becomes equal to 180° (grounded cathode) and when the modulus of this ratio, equal to the product of the slope of the tube multiplied by its load resistance, becomes equal to a previously defined value. It is not necessary to operate directly on the ratio $V_S/V_E$, but it is in fact sufficient to effect a modulus and phase comparison of the signals $V_S$ and $V_E$.

It is known, for more easily obtaining an adjustment convergence, to assign the modulus and phase adjustment parameters respectively to a single one of the variable elements forming the matching cell.

However, in the devices for detecting the optimum anode load impedance known up to now and operating in accordance with the third above-mentioned method, the phase matching detection, namely the measurement for determining the end of the phase adjustment, is dependent on the adjustment operations carried out on the modulus, and vice versa, which does not allow full benefit to be drawn from the anticipated results by distributing the adjustment parameters between the modulus and the phase.

The present invention has as its aim to avoid this drawback.

Moreover, the device for detecting the optimum anode load impedance in accordance with the invention allows, with respect to known devices, the accuracy of adjustment to be increased and the adjustment algorithm to be simplified, by seeking not extrema (variables depending on the levels) but zeros, which allows a great adjustment dynamic to be obtained depending on the power brought into play, but especially the adjustments to be made independent of this power, with immediate determination of the direction of variation of the adjustment elements.

SUMMARY OF THE INVENTION

According to the invention, the device for detecting the optimum anode load impedance of a tube transmitter in a high frequency transmission chain, this transmission chain comprising, besides the tube transmitter, a transmitting antenna and an impedance matching cell, with variable elements, interposed between the tube transmitter and the transmitting antenna, and this detection consisting in detecting, during the variation of the impedance presented to the anode by the impedance matching cell, the passage of the anode load impedance of the tube through a purely resistive previously defined value, this device, comprises means for phase shifting by $k\,(\pi/2)$ (with k being a positive or negative uneven integer) the phase difference existing between the input and output voltages of the tube, means for multiplying together the two voltages thus processed, and means for calculating the mean value of the product thus obtained, cancellation of this mean value corresponding to the passing of the anode load impedance through a purely resistive value, which makes the phase matching detection independent of the modulus matching detection.

BRIEF DESCRIPTION OF THE DRAWINGS

The objects and features of the present invention will be more clearly understood from reading the following description of one embodiment, said description being made with reference to the accompanying drawings in which.

DESCRIPTION OF THE PREFERRED EMBODIMENT

Figure 1:
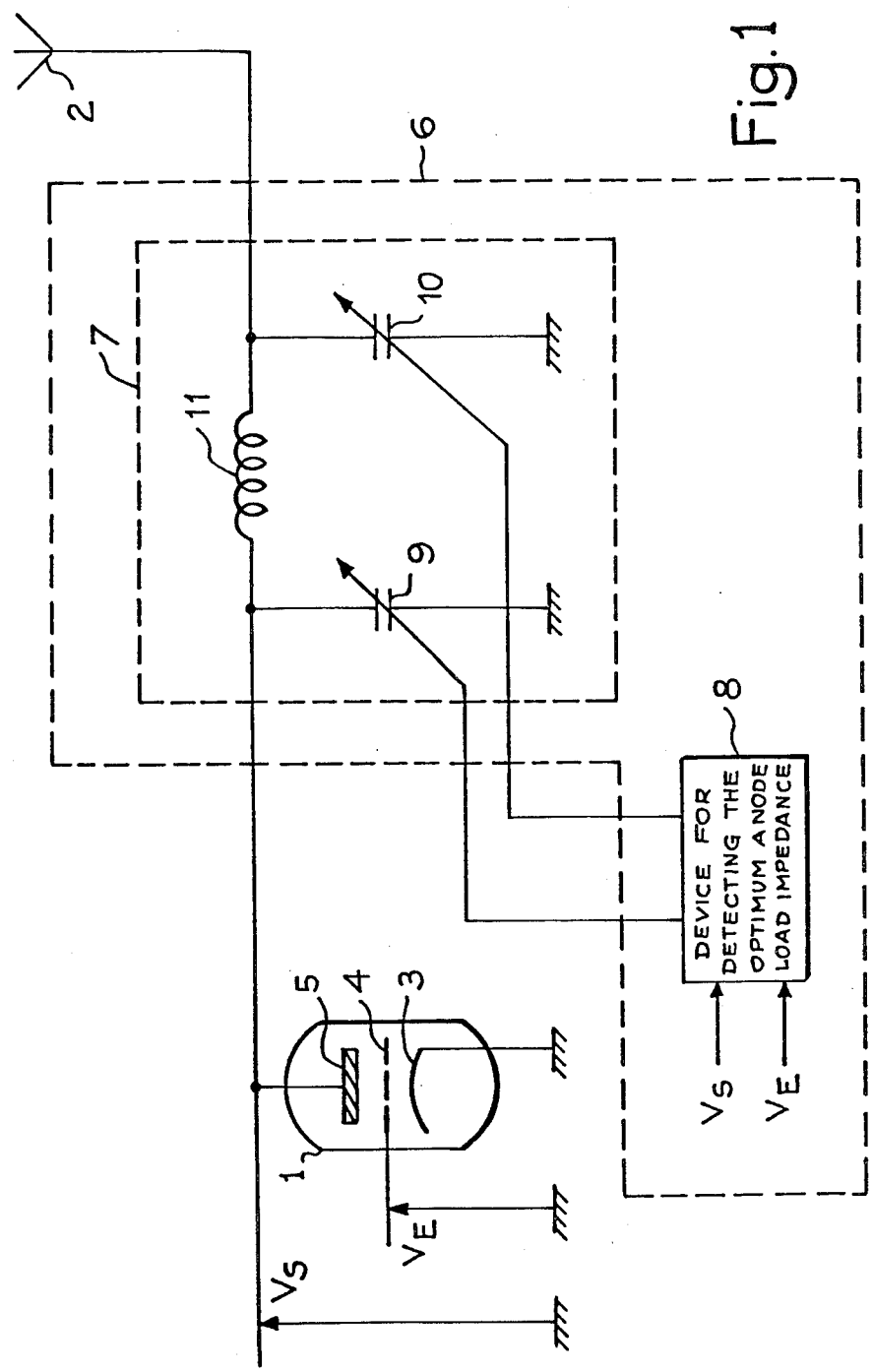
FIG. 1 shows a block diagram of a high frequency transmission chain in which is inserted a device for measuring the optimum anode load in accordance with the invention.

In FIG. 1 there is shown very schematically a high frequency transmission chain comprising a transmitting tube 1 and a transmitting antenna 2. The transmitting tube 1 comprises a cathode 3, a control electrode 4 to which an input voltage $V_E$ is applied and an output electrode 5 from which an output voltage $V_S$ is collected.

Between the transmitting tube 1 and the transmitting antenna 2 is interposed an impedance matching device 6, for matching the impedance of antenna 2 to a correct value for the anode of tube 1. In fact, antenna 2 has typically a complex impedance of the order of 50Ω, whereas the tube needs a real impedance, that is to say purely resistive, of the order of 2000 ohms.

The matching device 6 comprises an impedance matching cell 7 with variable elements, and a device 8 for detecting the optimum anode load impedance, intended for detecting, during the variation of the elements of cell 7, the moment when the load impedance of the tube becomes purely resistive and equal to the desired value.

For detecting the moment when the load impedance of the tube becomes purely resistive, since the tube is in general connected in a so-called "grounded cathode" circuit, it is necessary to identify, not the moment when the phase between $V_S$ and $V_E$ is cancelled out, but when this phase becomes equal to 180°.

The impedance matching cell 7 comprises several variable elements intitially prepositioned as a function of the frequency, namely two variable capacitors 9 and 10 and an inductance 11 for example. Inductance 11 is maintained constant during the whole of the adjustment. On the other hand, tuning is effected by means of the variable capacitors. Variable capacitor 9 is used for obtaining a phase shift of 180° between $V_S$ and $V_E$ whereas the variable capacitor 10 is used for obtaining a good amplitude ratio between $V_S$ and $V_E$. This is shown symbolically in FIG. 1 by means of the two separate controls for these two components.

Figure 2:
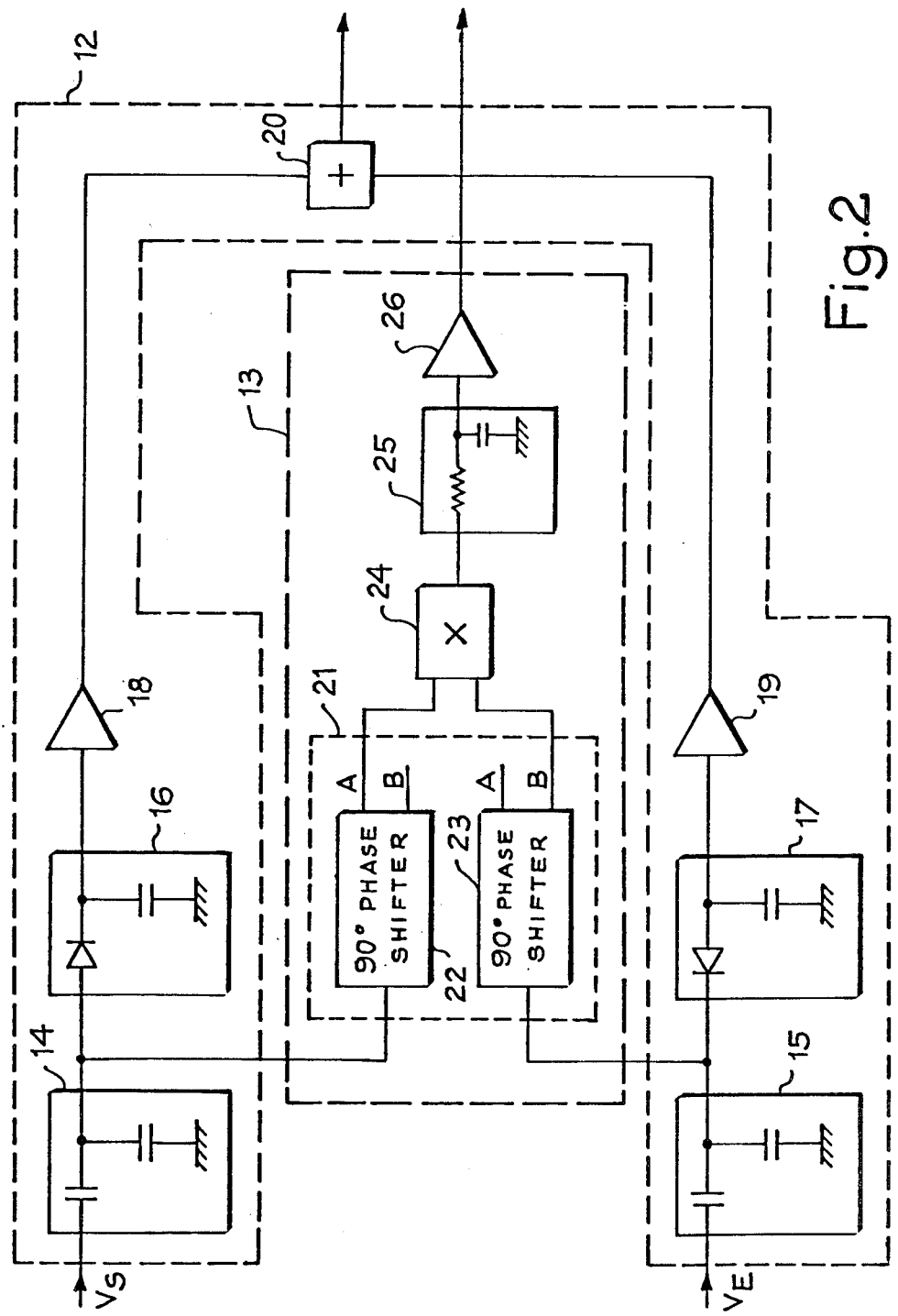
FIG. 2 shows a detailed diagram of a device for measuring the optimum anode load in accordance with the invention.

Device 8 for detecting the optimum anode load impedance in accordance with the invention allows the measurements on the phase between $V_S$ and $V_E$ to be made totally independent of the measurements on the modulus of the ratio $V_S/V_E$ and vice versa when the desired tuning is obtained. This device 8 is shown in FIG. 2. It comprises modulus matching detecting means 12 and phase matching detection means 13.

The modulus matching detection means 12 are conventionally formed by means of two capacitive dividers 14 and 15, one of which receives the input voltage $V_E$ and the other the output voltage $V_S$. The ratios of these two capacitive dividers are determined so that the output voltages $V_{S1}$ and $V_{E1}$ of these two dividers are equal when the input voltages $V_S$ and $V_E$ of these two dividers are in a ratio equal to the product of the slope of the tube multiplied by its desired anode load resistance. The modulus matching detection means also comprise a circuit for detecting equality between voltages $V_{E1}$ and $V_{S1}$, formed for example in the following way.

The capacitive dividers 14 and 15 are followed respectively by rectifying filters 16 and 17 which give respectively signals proportional to the peak value of the signals $V_{S1}$ and $V_{S2}$, and of opposite signs.

Each of these rectifying filters 16 and 17 is followed by an amplifier (18 and 19) and the outputs of these two amplifiers 18 and 19 are connected to the input of an analog adder 20 which supplies at its output modulus matching detection data.

In accordance with the invention, the phase matching detection means 13 comprise means 21 for phase-shifting by $\pm (\pi/2)$ the phase difference existing between voltages $V_S$ and $V_E$.

The means 21 comprise for example a first and second identical 90° phase shifters 22 and 23, each having an input connected to the output of one of the capacitive dividers 14 and 15.

Each phase shifter is provided with two outputs referenced A and B, one of which (A) supplies the signal present at the input of the phase shifter, phase-shifted by an amount $\alpha$ ($\alpha$ being any amount) and the other (B) supplies the signal collected at the output A phase-shifted by 90°. These phase shifters are well known in the technique and they will not be further described. They are for example 90° phase shifters of the R-C network quadripole type letting everything through.

The phase matching detection device also comprises an analog multiplier 24 having two inputs connected respectively to the output A of the phase shifter 22 and to the output B of the phase shifter 23, or to the output B of phase shifter 22 and to the output A of phase shifter 23.

The phase matching detection means 13 also comprise a circuit 25 for calculating the mean value (more especially by HF filtering), having an input connected to the output of multiplier 24 and an output which supplies the phase matching detection data through an amplifier 26. The phase matching detection device 13 shown in FIG. 2 operates in the following way.

Let $\theta_E$ and $\theta_S$ be the respective phases of the input $V_E$ and output $V_S$ voltages.

Further, let $\alpha$ be the phase shift provided by the identical phase shifters 22 and 23 between the signals taken from their outputs A and the signals present at their inputs.

In addition, let $\theta_{1A}$ and $\theta_{1B}$ on the one hand, and $\theta_{2A}$ and $\theta_{2B}$ on the other hand be the phases of the signals obtained respectively at the outputs A and B of phase shifter 22, on the one hand, and at the outputs A and B of phase shifter 23 on the other hand.

All these values are connected together by the following relationships:

$$\theta_{1A} = \theta_S + \alpha$$

$$\theta_{1B} = \theta_S + \alpha + \frac{\pi}{2}$$

$$\theta_{2A} = \theta_E + \alpha$$

$$\theta_{2B} = \theta_E + \alpha + \frac{\pi}{2}$$

Let now a and b be the amplitudes of the signals present respectively at the inputs of phase shifters 22 and 23 and w the pulsation of these signals. If we apply to the input of multiplier 24 the signals obtained respectively at the output A of phase shifter 22 and at the output B of phase shifter 23, we obtain at the output of this multiplier $$a \cos(wt + \theta_S + \alpha) \cdot b \cos\left(wt + \theta_E + \alpha + \frac{\pi}{2}\right)$$

which can also be written:

$$\frac{ab}{2}\left[\cos\left(2wt + \theta_S + \theta_E + 2\alpha + \frac{\pi}{2}\right) + \cos\left(\theta_S - \theta_E - \frac{\pi}{2}\right)\right]$$

The mean value of the first term of this sum being zero, the average value of ths sum is equal to $$\frac{ab}{2} \cos\left(\theta_S - \theta_E - \frac{\pi}{2}\right)$$

This result is obtained at the output of circuit 25 for calculating the mean value, more particularly by HF filtering so as to eliminate the first term of this sum.

It is known that phase matching is achieved when $\theta_S - \theta_E$ is equal to $\pi$. When $\theta_S - \theta_E$ is equal to $\pi$, $\theta_S - \theta_E - (\pi/2)$ is equal to $\pi/2$, and $$\frac{ab}{2} \cos\left(\theta_S - \theta_E - \frac{\pi}{2}\right)$$

is
equal to 0. Now, the only case where the adjustment effected for providing phase matching is independent of the amplitudes a and b is the case when $\theta_S - \theta_E - (\pi/2)$ is a multiple of $(\pi/2)$. Consequently, the processing carried out on signals $V_E$ and $V_S$ in accordance with the invention allows phase matching to be made independent of the amplitude of these signals.

The numerical values used in the above description only form an example for a better understanding of the invention. It must be emphasized that any phase shift by $k(\pi/2)$ (with k being a positive or negative uneven integer) applied to the phase shift existing between signals $V_S$ and $V_E$ allows the result of the invention to be obtained.

It should also be noted that the processing carried out on the phase of each of the signals $V_S$ and $V_E$ could be achieved in any way, other than the one which has been described above, providing that after this processing the phase difference between these two signals is shifted by $k(\pi/2)$ with respect to what it was before the processing.

What is claimed is:

1. A device for detecting the optimum anode load impedance of a transmitter tube in a high frequency transmitting chain, this transmitting chain comprising besides the tube, a transmitting antenna, the device comprising a variable impedance matching cell interposed between the tube and the transmitting antenna, said cell detecting said optimum anode load impedance of said tube, by detecting, from an input and an output voltage of said tube, during the variation of the impedence presented to said anode of said tube by said matching cell, a passing of said anode load impedance through a pre-determined purely resistive value; said cell comprising means for phase shifting by $k(\pi/2)$ (with k being a positive or negative uneven integer) the phase difference between said input and output voltages of said tube, means for multiplying by each other the two voltages thus processed, and means for calculating the mean value of the product thus obtained, and for cancelling this mean value, during the variation of the impedance matching cell corresponding to the passing of the anode load impedance through a purely resistive value.

2. The device as claimed in claim 1, wherein the means for phase shifting by $k(\pi/2)$ comprises identical first and second 90° phase shifters, each adapted to supply, from one of the input and output voltages of the tube, at a first output, a first voltage phase shifted by any value with respect to the input voltage of the phase shifter, and at a second output, a second voltage phase shifted by 90° with respect to the voltage available at the first output.

3. The device as claimed in claim 2, wherein the multiplication means comprise a multiplier having two inputs connected, one to the first output of the first phase shifter and the other to the second output of the second phase shifter.

4. The device as claimed in claim 2, wherein the multiplication means comprise a multiplier having two inputs connected, one to the second output of the first phase shifter and the other to the first output of the second phase shifter.

* * * * *